United States Patent
Cho et al.

(10) Patent No.: US 9,418,713 B2
(45) Date of Patent: Aug. 16, 2016

(54) APPARATUS AND METHOD FOR SENSE AMPLIFYING

(71) Applicant: TAIWAN SEMICONDUCTOR MANUFACTURING CO., LTD., Hsin-Chu (TW)

(72) Inventors: Caleb Yu-Sheng Cho, Zhubei (TW); Jih-Chen Wang, Hsinchu (TW); Yu-Fan Lin, Guishan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/723,491

(22) Filed: May 28, 2015

(65) Prior Publication Data
US 2015/0262629 A1    Sep. 17, 2015

Related U.S. Application Data

(63) Continuation of application No. 13/729,065, filed on Dec. 28, 2012.

(51) Int. Cl.

| G11C 7/06 | (2006.01) |
|---|---|
| G11C 7/14 | (2006.01) |
| G11C 7/02 | (2006.01) |
| G11C 7/08 | (2006.01) |
| G11C 11/4091 | (2006.01) |
| G11C 29/02 | (2006.01) |
| G11C 7/12 | (2006.01) |

(52) U.S. Cl.
CPC ... *G11C 7/062* (2013.01); *G11C 7/02* (2013.01); *G11C 7/08* (2013.01); *G11C 7/12* (2013.01); *G11C 7/14* (2013.01); *G11C 11/4091* (2013.01); *G11C 29/021* (2013.01); *G11C 29/026* (2013.01); *G11C 29/028* (2013.01)

(58) Field of Classification Search
CPC ............ G11C 7/062; G11C 7/12; G11C 7/14; G11C 29/028; G11C 29/021; G11C 29/026; G11C 11/4091; G11C 7/02; G11C 7/08
See application file for complete search history.

(56) References Cited

U.S. PATENT DOCUMENTS

| 5,237,533 | A | 8/1993 | Papaliolios | |
|---|---|---|---|---|
| 5,694,369 | A * | 12/1997 | Abe | G11C 7/14 365/189.05 |
| 7,057,957 | B2 | 6/2006 | Wang | |
| 2003/0155948 | A1 | 8/2003 | Chung et al. | |
| 2006/0120175 | A1 | 6/2006 | Chou et al. | |
| 2010/0226162 | A1* | 9/2010 | Madan | G11C 5/005 365/145 |

* cited by examiner

*Primary Examiner* — Han Yang
*Assistant Examiner* — Ajay Ojha
(74) *Attorney, Agent, or Firm* — Duane Morris LLP (57) ABSTRACT

A sense amplifier includes four sub-circuits: pre-charge, sense enable, sense output, and buffer. The pre-charge sub-circuit provides a voltage between zero volts and the positive power supply (denoted $V_{DD}$) to the sense enable sub-circuit. The sense enable sub-circuit is configured to adjust the received voltage based on the sensed value of bit lines and sends the adjusted voltage to the sense output sub-circuit. The sense output sub-circuit removes interference, inverts and amplifies the adjusted voltage, and sends an output voltage to the buffer sub-circuit. The buffer sub-circuit amplifies the output voltage of the sense output sub-circuit and provides it to an output bus.

19 Claims, 6 Drawing Sheets

APPARATUS AND METHOD FOR SENSE AMPLIFYING

CROSS REFERENCE TO RELATED APPLICATIONS

This application is a continuation of U.S. patent application Ser. No. 13/729,065, filed Dec. 28, 2012.

FIELD

Aspects of the present disclosure generally relate to semiconductor memories. More particularly, aspects of the present disclosure relate to sense amplification in random access memories.

BACKGROUND

Static random access memory (SRAM) is a type of semiconductor memory that uses bi-stable circuitry to form a memory cell. Dynamic random access memory (DRAM) is another type of semiconductor memory that uses capacitors as a memory cell. Each memory cell stores a single bit and is connected to bit lines and word lines. When reading a selected memory cell, a pre-charge voltage is applied and the bit value is transferred from the memory cell to the bit lines creating a small voltage difference across the bit lines. A sense amplifier measures this small voltage difference across the bit lines and translates it to a full logic signal that may be used in digital logic.

A sense amplifier impacts a memory's access time because the sense amplifier is an intermediary between a memory cell and the output of a random access memory (RAM). Additionally, a sense amplifier impacts the power consumed during memory reading because it must boost the small voltage difference across the bit lines to a higher voltage digital logic signal. Thus the design and performance of a sense amplifier is a critical component of key RAM performance parameters. Existing sense amplifiers cannot achieve the high speed and low power consumption desired by new computing and processing technology.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
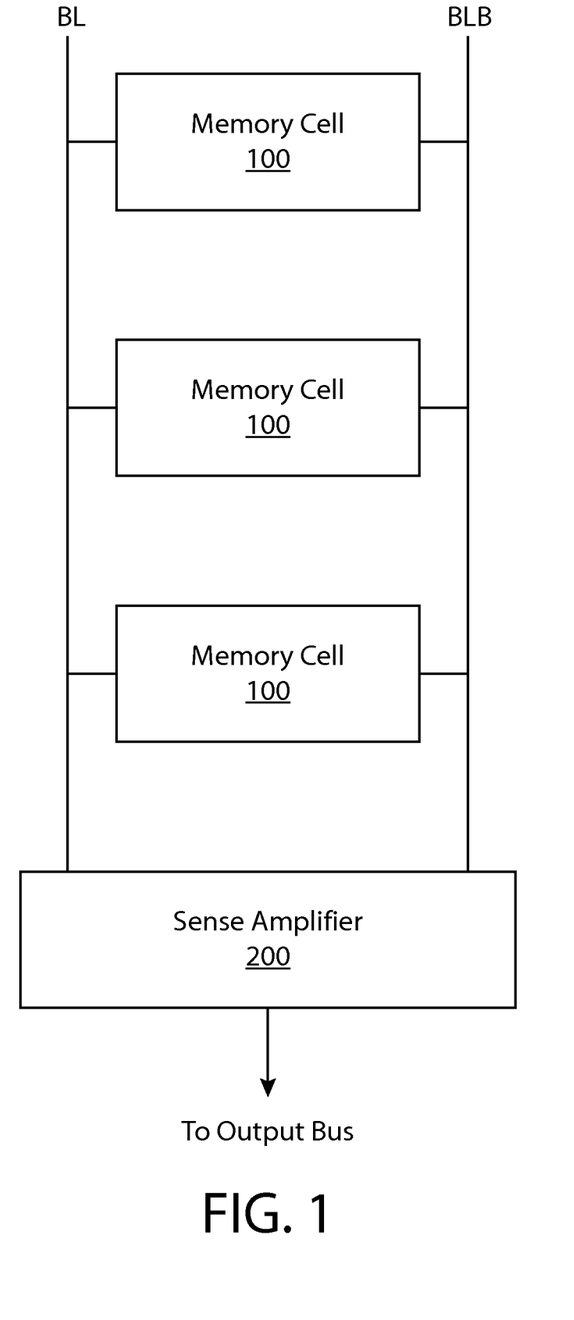
FIG. 1 is a diagram of a random access memory circuit.

FIG. 1 is a diagram illustrating one example of the relative positions of memory cells 100 and a sense amplifier 200. Sense amplifier 200 is connected via bit lines (denoted BL and BLB) to a plurality of memory cells 100. Sense amplifier 200 is used to read memory cells 100 and provide a digital logic signal to an output bus.

Figure 2:
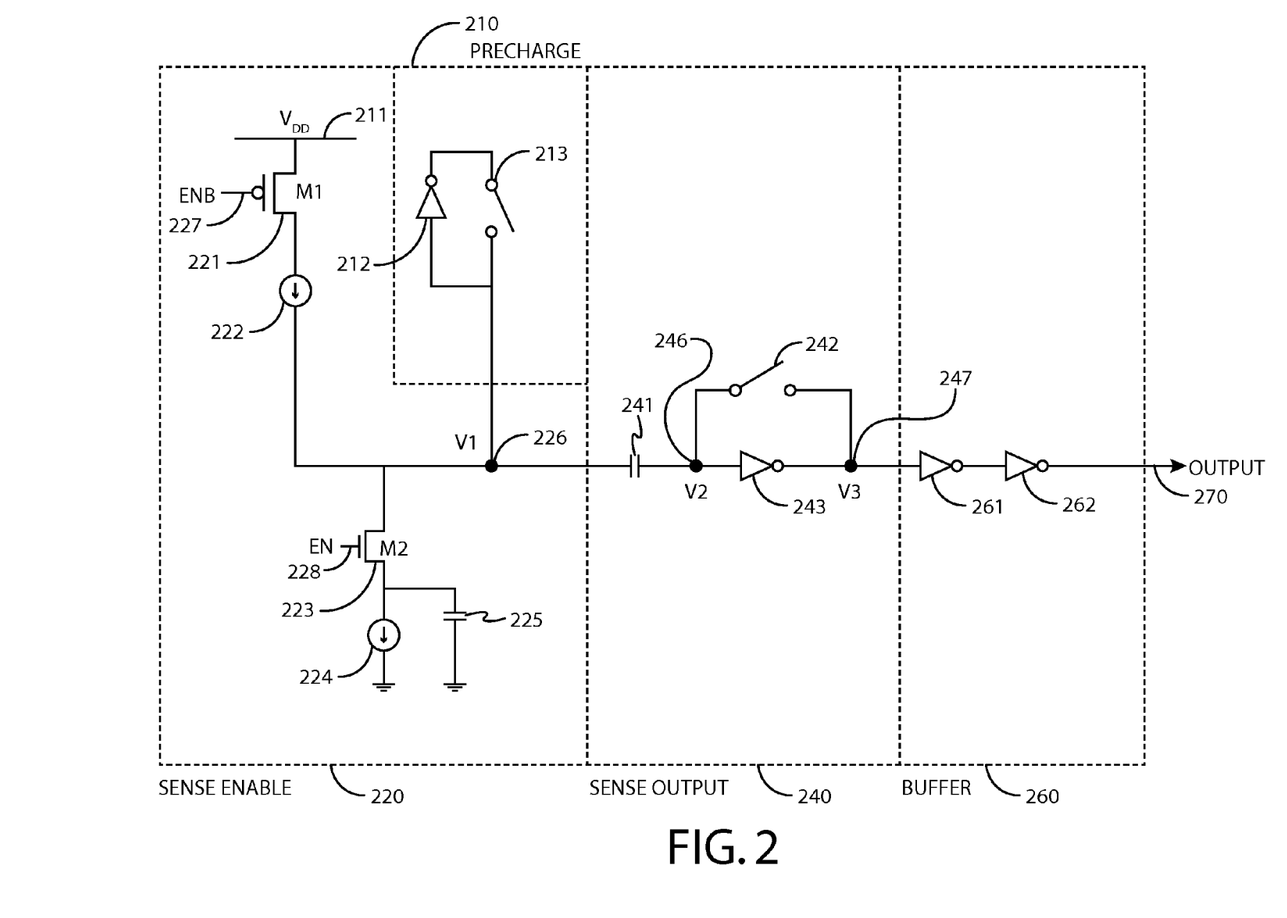
FIG. 2 is a circuit diagram of a sense amplifier in accordance with some embodiments of the present disclosure.

FIG. 2 is a circuit diagram of one example of a sense amplifier in accordance with some embodiments of the present disclosure. FIG. 2 shows four sub-circuits: a pre-charge sub-circuit 210, a sense enable sub-circuit 220, a sense output sub-circuit 240, and a buffer sub-circuit 260.

Pre-charge sub-circuit 210 comprises inverter 212 disposed in parallel with switch 213 and connected to V1 node 226. Inverter 212 is a standard complementary metal oxide semi-conductor (CMOS) comprising a P-type metal oxide semiconductor (PMOS) field effect transistor (FET) and N-type metal oxide semiconductor (NMOS) FET connected to a positive power supply node (denoted $V_{DD}$) and ground. In some embodiments, the voltage threshold of inverter 212 is $V_{DD}/2$ and therefore pre-charge sub-circuit 210 supplies a voltage at V1 node 226 of $V_{DD}/2$. As described in greater detail below, there are numerous pre-charge sub-circuit configurations and inverter voltage thresholds that can supply the pre-charge voltage at V1 node 226 between zero volts and $V_{DD}$.

Sense enable sub-circuit 220 comprises a P-type metal oxide semiconductor (PMOS) field effect transistor (FET) 221 having its source connected to power supply 211, which is set at $V_{DD}$, its gate connected to inverse sense enable line 227, and its drain connected to current source 222, which provides a reference current to node 226. Sense enable sub-circuit 220 also includes a N-type metal oxide semiconductor (NMOS) FET 223 with its drain connected to V1 node 226, its gate connected to sense enable line 228, and its source connected to current source 224, which represents the cell current of the bit cell. Capacitor 225 is connected in parallel with current source 224. Although transistors 221 and 223 are described as being metal oxide semiconductor field effect transistors (MOSFETs), one of ordinary skill in the art will understand that other types of transistors can be used.

Sense output sub-circuit 240 comprises capacitor 241 connected between V1 node 226 and V2 node 246, which is coupled to inverter 243 and to switch 242. Switch 242 is disposed in parallel with inverter 243 between V2 node 246 and V3 node 247.

Buffer sub-circuit 260 comprises at least two serially-connected inverters (261 and 262). Buffer sub-circuit amplifies the output voltage of sense output sub-circuit 240 before outputting the voltage to output bus 270.

The sense amplifier operates in two distinct phases known as the pre-charge phase and the sensing phase. During the pre-charge phase, pre-charge sub-circuit 210 provides a pre-charge voltage to sense enable sub-circuit 220 and sense output sub-circuit 240 as these sub-circuits are coupled to V1 node 226. Switch 213 is shut to provide a voltage at V1 node 226 of $V_{DD}/2$. Sense enable sub-circuit 220 outputs the pre-charge voltage received from pre-charge sub-circuit 210 to the memory circuit's bit lines. Switch 242 is shut to equalize the voltage at V2 node 246 and V3 node 247 and set the voltage at these nodes to the threshold voltage of inverter 243.

During the sensing phase, sense enable sub-circuit 220 senses the value of the bit lines at inverse sense enable line 227 and sense enable line 228, which causes the voltage at V1 node 226 to be raised or lowered based on the value of the bit lines. Switch 213 and switch 242 open at the start of the sensing phase. More specifically, if cell current, which is represented by current source 224, is greater than the reference current, which is represented by current source 222, then the voltage at V1 node 226 will be at a "low" state as charge flows away from node 226 to ground. If the cell current, which is represented by current source 224, is less than the reference current, which is presented by current source 222, V1 node 226 will be at a "high" state due to charge accumulating at node 226.

The adjusted voltage at V1 node 226 is capacitively coupled to sense output sub-circuit 240 as either "high" (approaching $V_{DD}$) or "low" (approaching zero volts) through capacitor 241, which is coupled to node 246. Switch 242 opens and sense output sub-circuit 240 receives the adjusted voltage V1, which is voltage at node 226, from sense enable sub-circuit 220. As will be understood by one of ordinary skill in the art, capacitor 241 isolates direct current (DC) voltage via the capacitive coupling. Inverter 243 inverts the voltage level received at its input from capacitor 241 and outputs a voltage to buffer sub-circuit 260. As will be understood by one of ordinary skill in the art, the voltage output from inverter 243 will be at a logic low level (e.g., VSS or ground level) or at a logic high level (e.g., VDD).

Figure 3:
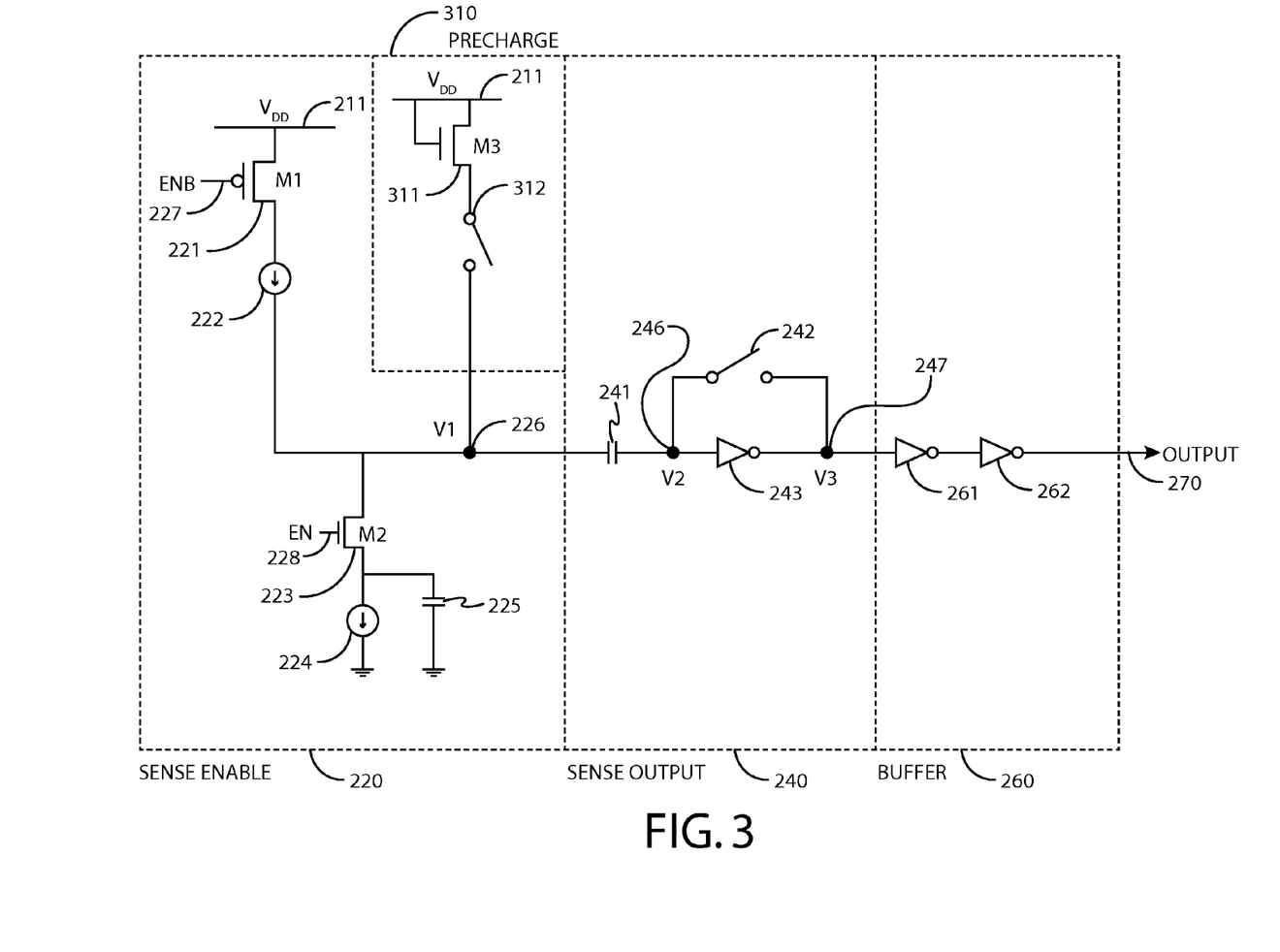
FIG. 3 is a circuit diagram of a sense amplifier in accordance with some embodiments of the present disclosure.

FIG. 3 is a circuit diagram of another example of a sense amplifier in accordance with some embodiments of the present disclosure. In this embodiment, sense enable sub-circuit 220, sense output sub-circuit 240, and buffer sub-circuit 260 remain the same as in FIG. 2 and as described above. Pre-charge sub-circuit 310 comprises NMOS transistor 311 whose drain and gate are connected to power supply 211, which is set at $V_{DD}$, and whose source is connected to switch 312. Switch 312 is connected to V1 node 226. This configuration provides a charging voltage at V1 node 226 equal to $V_{DD}$–Vt. The embodiment illustrated in FIG. 3 is not limited to NMOS transistor 311 but contemplates additional transistors of other types or additional configurations as will be understood by one of ordinary skill in the art.

Figure 4:
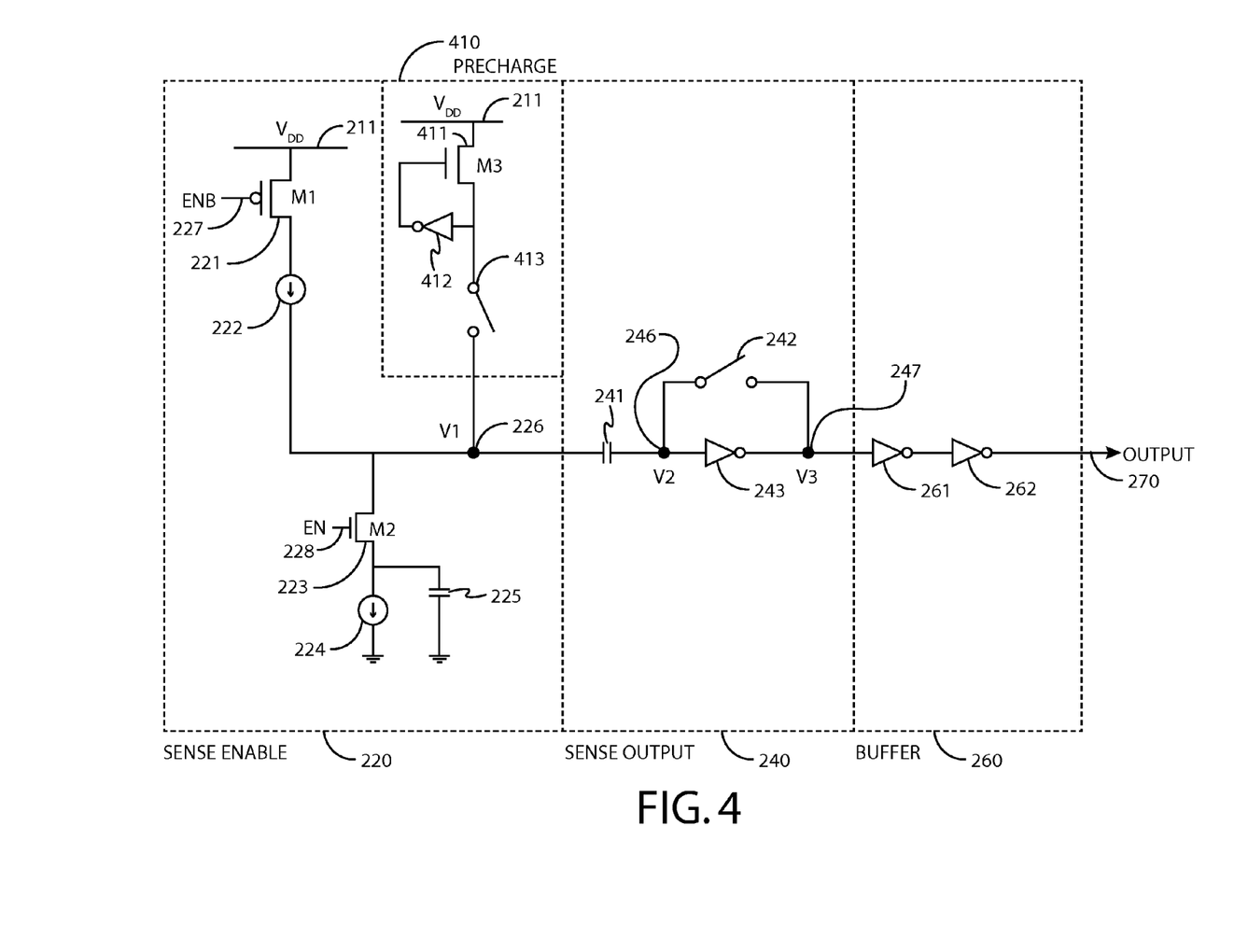
FIG. 4 is a circuit diagram of a sense amplifier in accordance with some embodiments of the present disclosure.

FIG. 4 is a circuit diagram of another example of a sense amplifier in accordance with some embodiments of the present disclosure. In the embodiment illustrated in FIG. 4, sense enable sub-circuit 220, sense output sub-circuit 240, and buffer sub-circuit 260 remain the same as in FIG. 2 and as described above. Pre-charge sub-circuit 410 comprises NMOS transistor 411, an inverter 412, and a switch 413. These three components are configured such that the drain of NMOS transistor 411 is connected to power supply 211, which is set at $V_{DD}$, the source of NMOS transistor 411 is connected to the inputs of both inverter 412 and switch 413, and the gate of NMOS transistor 411 is connected to the output of inverter 412. Switch 413 connects the source of NMOS transistor 411 and inverter 412 to V1 node 226. This configuration provides a charging voltage at V1 node 226 of $\alpha V_{DD}$, where $\alpha$ is a pre-determined scaling factor between 0 and 1. The embodiment illustrated in FIG. 4 is not limited to NMOS transistor 411 but contemplates additional transistors of other types or additional configurations as will be understood by one of ordinary skill in the art.

Figure 5:
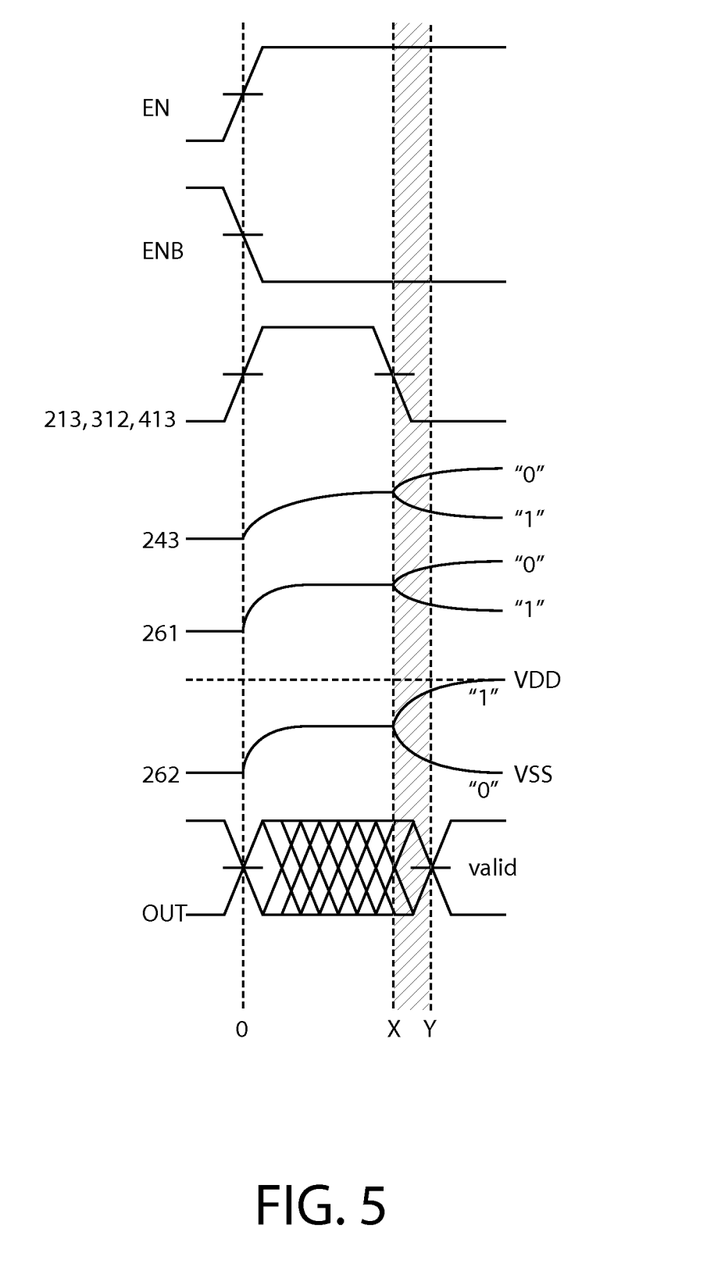
FIG. 5 is a timing diagram in accordance with some embodiments.

FIG. 5 is a timing diagram illustrating the voltages at selected locations in a sense amplifier circuit in accordance with the various sense amplifiers disclosed herein. There are two phases shown: the pre-charge phase, from time 0 to time x, and the sensing phase, from time x to time y. During the pre-charge phase, a pre-charge voltage between zero volts and $V_{DD}$ is provided by pre-charge sub-circuit 210 to V1 node 226, which is coupled to sense enable sub-circuit 220, and corresponds to the voltage V1 in FIG. 5. Switch 242 is shut, allowing voltage at V2 node 246 and V3 node 247 to charge to the threshold voltage of inverter 243 as indicated by voltages V2 and V3 in FIG. 5. Additionally, the bit lines are pre-charged in preparation for the sensing phase.

The sensing phase begins at time x, and the voltage at V1 node 226 and V2 node 246 will be driven higher or lower depending on the bit value in the memory cell. If the cell current, which is represented by current source 224, is greater than the reference current, which is represented by current source 222, then the voltage level V1 will be a low logic state as charge flows away from node 226 to ground. The voltage level V2 at node 246 will be capacitively coupled to a "low" logic state via its coupling to node 226 through capacitor 241.

If the cell current, which is represented by current source 224, is less than the reference current, which is represented by current source 222, then the voltage V1 at node 226 will be at a high logic level due to charge accumulating at node 226. The voltage V2 at node 246 also will be at a "high" state due to node 246 being capacitively coupled to node 226.

The voltage V3 at node 247 is opposite the voltage level at node 246 such that the voltage V3 at node 247 is driven high for a bit value of "1" if the voltage at node 246 is a logic low and is driven low for a bit value of "0" if the voltage at node 246 is a high logic value. Also, as shown in FIG. 5, voltage V3 at node 247 has a steeper slope due to the gain of inverter 243. After passing through buffer sub-circuit 260, the output of the sense amplifier is a digital logic signal of "1"—high—or "0"—low.

Figure 6:
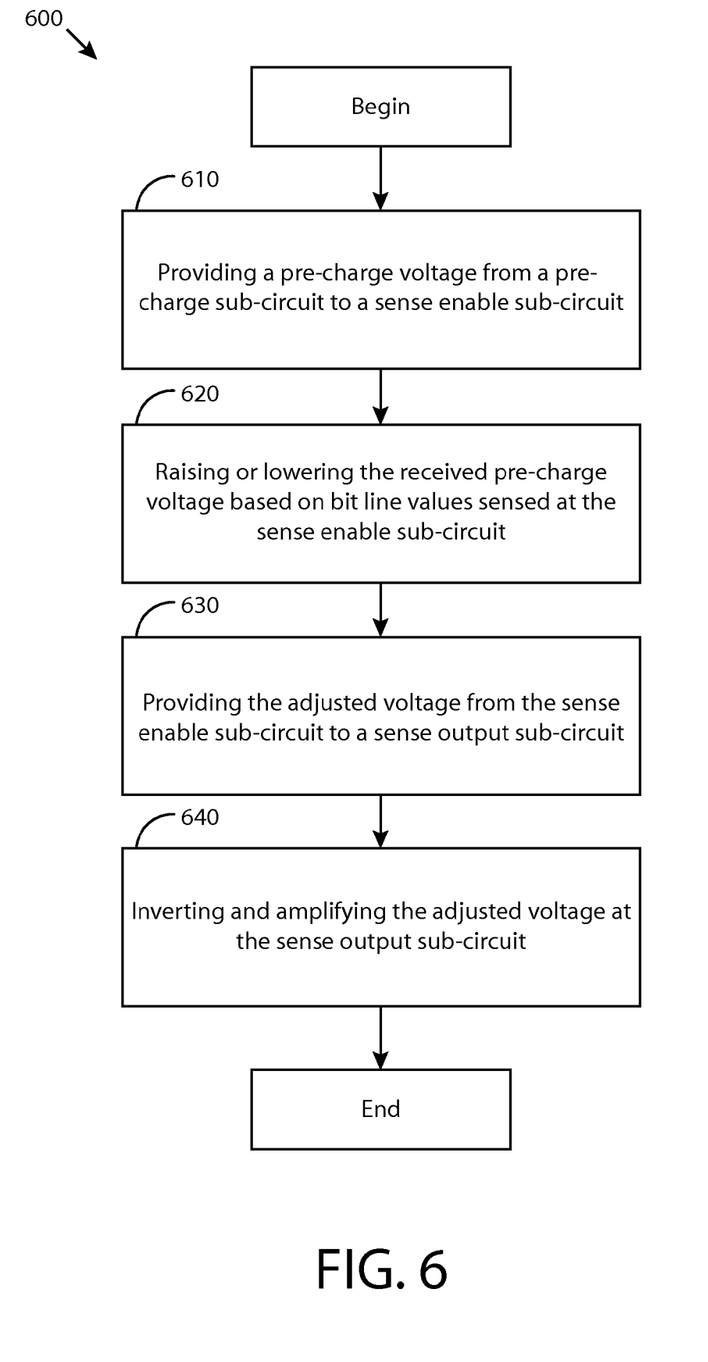
FIG. 6 is a flow diagram of a process in accordance with some embodiments.

FIG. 6 is a flow diagram of one example of a method in accordance with some embodiments. After process 600 begins, a pre-charge sub-circuit provides a pre-charge voltage to a sense enable sub-circuit at block 610. This is accomplished by shutting switch 213 to provide a voltage at V1 node 226 of $V_{DD}/2$, the threshold voltage of inverter 212. Sense enable sub-circuit 220 outputs the pre-charge voltage received from pre-charge sub-circuit 210 to the memory circuit's bit lines. Switch 242 is shut to equalize the voltage at V2 node 246 and V3 node 247 and set the voltage at these nodes to the threshold voltage of inverter 243.

At block 620, the sense enable sub-circuit raises or lowers the received pre-charge voltage based on bit line values sensed at the sense enable sub-circuit. More specifically, if the cell current, which is represented by current source 224, is greater than the reference current, which is represented by current source 222, then the voltage V1 at node 226 will be at a "low" state as charge drains to ground away from node 226 faster than it is received from VDD. If the cell current, which is represented by current source 224, is less than the reference current, which is represented by current source 222, then the voltage V1 at node 226 will be at a "high" state due to charge accumulating at node 226 as it is received from VDD faster than it drains to ground.

At block 630, the adjusted voltage is provided from the sense enable sub-circuit to the sense output sub-circuit. Switch 242 opens and the adjusted voltage at V1 node 226 is sent to sense output sub-circuit 240 via capacitor 241, which performs direct current isolation through capacitive coupling. The adjusted voltage is either "high" (approaching $V_{DD}$) or "low" (approaching zero volts).

At block 640, the adjusted voltage is inverted and amplified by a sense output circuit. Inverter 243 inverts and amplifies the voltage received at its input from capacitor 241.

The sense amplifier embodiments described above include several advantages. First, capacitor 241 provides capacitive coupling between the sense enable and sense output sub-circuits, preventing the formation of a voltage or power imbalance between the sub-circuits and eliminating potential direct current interference. Second, the embodiments described above achieve faster memory read speeds than existing art in the field. Third, these faster read speeds are achieved without sacrificing the low power consumption of the sense amplifier or requiring a significant penalty in the sense amplifier's area requirements in the memory chip.

In some embodiments a sense amplifier comprises a pre-charge sub-circuit configured to provide a pre-charge voltage to a sense enable sub-circuit, said sense enable sub-circuit configured to sense a voltage difference between a pair of bit lines to which the sense enable sub-circuit is coupled, to adjust the received pre-charge voltage based on said voltage difference between the pair of bit lines, and to output the adjusted voltage to a sense output sub-circuit, and said sense output sub-circuit configured to invert and to amplify said adjusted voltage.

In some embodiments a sense amplifier comprises a pre-charge sub-circuit for providing a pre-charge voltage to a sense enable sub-circuit, said sense enable sub-circuit for reading bit lines values, adjusting the received pre-charge voltage based on said bit line values, and sending the adjusted voltage to a sense output sub-circuit, said sense output sub-circuit for inverting and amplifying said adjusted voltage, and a capacitor providing capacitive coupling between said sense enable sub-circuit and said sense output sub-circuit.

In some embodiments a method comprises providing a pre-charge voltage from a pre-charge sub-circuit to a sense enable sub-circuit, raising or lowering the received pre-charge voltage at said sense enable sub-circuit based on bit line values sensed at said sense enable sub-circuit, providing the adjusted voltage to a sense output sub-circuit, and inverting and amplifying said adjusted voltage at said sense output sub-circuit.

Although examples are illustrated and described herein, embodiments are nevertheless not limited to the details shown, since various modifications and structural changes may be made therein by those of ordinary skill within the scope and range of equivalents of the claims.

What is claimed is:

1. A sense amplifier comprising:
a plurality of memory cells coupled between a bit line and a bit line bar;
a sense enable sub-circuit coupled to the bit line and the bit line bar, the sense enable sub-circuit comprising a first transistor having a gate coupled to the bit line and a second transistor having a gate coupled to the bit line bar, wherein the second transistor has a source coupled to a positive power supply node and a drain coupled to a common node coupling the sense enable sub-circuit to a pre-charge sub-circuit and to the sense output sub-circuit; and
wherein the sense enable sub-circuit is configured to sense a voltage difference between the bit line and the bit line bar, to adjust a pre-charge voltage based on the voltage difference, and to output the adjusted pre-charge voltage to a sense output sub-circuit.

2. The sense amplifier of claim 1 wherein the first transistor has a drain coupled to the common node and the first transistor has a source coupled to ground.

3. The sense amplifier of claim 2 wherein the first transistor is an NMOS transistor and the second transistor is a PMOS transistor.

4. The sense amplifier of claim 2 wherein the pre-charge sub-circuit comprises an inverter disposed in parallel with a switch, with both inverter and switch coupled to a common node linking the pre-charge sub-circuit with the sense enable sub-circuit and to the sense output sub-circuit.

5. The sense amplifier of claim 2 wherein the pre-charge sub-circuit comprises a transistor having a drain and a gate coupled to a positive power supply node and having a source coupled to a switch, the switch further coupled to a common node coupling the pre-charge sub-circuit to the sense enable sub-circuit and to the sense output sub-circuit.

6. The sense amplifier of claim 2 wherein the pre-charge sub-circuit comprises a transistor, an inverter, and a switch, configured such that the transistor has a drain coupled to a positive power supply node, a source coupled to the input of the inverter and the switch, and a gate coupled to the output of the inverter, wherein the output of the switch is further coupled to a common node coupling the pre-charge sub-circuit to the sense enable sub-circuit and to the sense output sub-circuit.

7. The sense amplifier of claim 2 wherein the sense output sub-circuit is configured to receive the adjusted pre-charge voltage via a capacitor and to invert and to amplify said adjusted pre-charge voltage to create an output voltage.

8. The sense amplifier of claim 7 wherein the sense output sub-circuit comprises an inverter, a switch, and a capacitor, the capacitor coupled in series between the sense enable sub-circuit and the inverter, wherein the inverter is coupled in parallel with the switch.

9. The sense amplifier of claim 8 further comprising a buffer sub-circuit comprising a pair of inverters and coupled to the sense output sub-circuit.

10. The sense amplifier of claim 9 wherein the sense output sub-circuit is coupled to an output bus.

11. A sense amplifier comprising:
a pre-charge sub-circuit configured to provide a pre-charge voltage to a sense enable sub-circuit;
the sense enable sub-circuit comprising a first transistor having a gate coupled to a sense enable line and a second transistor having a gate coupled to an inverse sense enable line, and wherein the sense enable sub-circuit is configured to sense a voltage difference between the sense enable line and the inverse sense enable line, to adjust the pre-charge voltage based on the voltage difference, and to output the adjusted voltage to a sense output sub-circuit; and
said sense output sub-circuit configured to receive the adjusted pre-charge voltage via a capacitor and to invert and to amplify said adjusted pre-charge voltage.

12. The sense amplifier of claim 11 further comprising a buffer sub-circuit comprising a pair of inverters and coupled to the sense output sub-circuit.

13. The sense amplifier of claim 12 wherein said pre-charge subcircuit comprises an inverter having a threshold voltage equal to one half of the voltage of the positive power supply node.

14. The sense amplifier of claim 12 wherein said pre-charge subcircuit comprises an inverter having a threshold voltage equal to the voltage of the positive power supply node minus Vt.

15. The sense amplifier of claim 12 wherein said pre-charge subcircuit comprises an inverter having a threshold voltage equal to the voltage of the positive power supply node multiplied against a scaling factor between 0 and 1.

16. The sense amplifier of claim 12 wherein the first transistor is a NMOS transistor.

17. The sense amplifier of claim 16 wherein the second transistor is a PMOS transistor.

18. The sense amplifier of claim 11, further comprising a memory cell coupled between the sense enable line and inverse sense enable line.

19. The sense amplifier of claim 12 further comprising an output bus adapted to receive an output voltage from said buffer sub-circuit.

* * * * *